United States Patent [19]

Alley et al.

[11] Patent Number: 5,403,665
[45] Date of Patent: Apr. 4, 1995

[54] METHOD OF APPLYING A MONOLAYER LUBRICANT TO MICROMACHINES

[75] Inventors: Rodney L. Alley, El Cerrito; Roger T. Howe, Lafayette; Kyriakos Komvopoulos, Orinda, all of Calif.

[73] Assignee: Regents of the University of California, Berkeley, Calif.

[21] Appl. No.: 79,611

[22] Filed: Jun. 18, 1993

[51] Int. Cl.⁶ ............................................ B31B 9/04
[52] U.S. Cl. ........................ 428/447; 156/643; 156/647; 310/309; 427/309; 427/352; 427/354; 427/387; 427/435; 428/450
[58] Field of Search ............... 156/643, 647; 427/384, 427/387, 309, 352, 354, 435; 310/309; 428/441, 447, 450

[56] References Cited

U.S. PATENT DOCUMENTS 4,740,410 4/1988 Muller et al. ............... 156/644 X
4,943,750 7/1990 Howe et al. ............... 310/42 X
5,252,881 10/1993 Muller et al. ............... 310/42 X

OTHER PUBLICATIONS

DePalma, Vito et al, "Friction and Wear of Self-Assembly Trichlorosilane Monolayer Films on Silicon", Eastman Kodak Company, Mar. 1, 1989.

Primary Examiner—Michael Lusignan
Attorney, Agent, or Firm—Flehr, Hohbach, Test, Albritton & Herbert

[57] ABSTRACT

A micromachine is lubricated in a fluid-based process. The known fluid-based process of releasing a sacrificial layer from a micromachine is followed by a fluid-based hydrophilic processing of the micromachine surfaces. A lubricating monolayer surface is then formed on the resultant hydrophilic micromachine surfaces. Afterwards, the surfaces are dried through conventional means.

19 Claims, 2 Drawing Sheets

METHOD OF APPLYING A MONOLAYER LUBRICANT TO MICROMACHINES

BRIEF DESCRIPTION OF THE INVENTION

This invention relates generally to miniature instruments commonly called micromachines. More particularly, this invention relates to a method of applying a monolayer lubricant to micromachines during a fluid-based release etch process.

BACKGROUND OF THE INVENTION

Micromachines (also called micromechanical devices or microelectromechanical devices) are small (micron scale) machines which promise to miniaturize instrumentation in the same way microelectronics have miniaturized electronic circuits. Micromachines include a variety of devices such as motors and gear trains analogous to conventional macroscale machinery. As is the case with macroscale machines, it is desirable to lubricate micromachines. Unfortunately, there are a number of problems associated with the lubrication of micromachines.

One problem with the lubrication of micromachines is that they have smooth surfaces and large surface-area-to-volume ratios. As a result, the intrinsic adhesion forces at contacting surfaces have greater significance than in macroscale machinery. Adhesion between moving and stationary parts, in excess of the small motive forces applied by micromachines, is a commonly encountered problem.

One function of a lubricant is to reduce such adhesion forces by serving as a low adhesion mediating layer, thereby preventing direct contact between higher adhesion mechanical parts. The lower the adhesion, the lower the friction and wear of the mechanical parts.

A fluid lubricant is typically used in macroscale machines to insure that fresh lubricant flows back over areas where interacting surfaces scrape the protective lubricant film. Unfortunately, conventional fluid lubricants introduce undesirable energy loss mechanisms of their own through fluid capillarity and viscosity. Thus, it would be highly desirable to develop a lubricant without the concomitant shortcomings of capillarity and viscosity associated with fluid lubricants.

The corrosive chemicals and high temperature processing involved in micromachine fabrication precludes lubricant application prior to the end of the fabrication process. At this terminal fabrication stage, the micromachine is fully and irreversibly assembled. The surfaces that must be lubricated are often hidden in the interior of the machine, and are perhaps already in physical contact with opposing surfaces. Consequently, the application of a lubricant must render full but not excessive coverage of lubricant on these hidden and contacting surfaces.

The terminal stage of micromachine fabrication processing involves removal of sacrificial layers encasing the functional parts of the micromachine. In one large group of micromachines, the functional parts are made of polycrystalline silicon (polysilicon) that is encased in silicon oxide sacrificial material. The silicon oxide is removed in a release etch using aqueous hydrofluoric (HF) acid. Following this etching, a micromachine is rinsed to remove leftover HF acid. Afterwards, it is dried.

In the prior art, a micromachine is lubricated after the drying step. The problem with this approach is that adhesion between the parts of the micromachine is more likely at this juncture. Thus, it would be highly desirable if the aqueous release etch steps could be combined with lubricant application steps. In such a process, the micromachine would be continuously immersed in liquids until the end of the process. As a result, a single drying step would be involved and the low-adhesion lubricant layer would already be in place when drying was completed.

Micromachines are often powered electrically. Electrical currents can leak across the surfaces of what are nominally insulating materials such as silicon oxide and silicon nitride. Leakage current results in energy loss. Electrical passivation of these surfaces to reduce this leakage is therefore a desirable function of the lubricant layer.

OBJECTS AND SUMMARY OF THE INVENTION

Thus, it is a general object of the present invention to provide a lubricant for micromachines.

It is another object of the invention to provide a lubricant application process that incorporates standard wet processing steps associated with micromachine fabrication.

It is a related object of the invention to provide a micromachine lubricant that can be readily applied to hidden and contacting surfaces on a micromachine.

It is another object of the invention to provide a micromachine lubricant that does not have the capillarity and viscosity problems associated with traditional lubricants.

It is another object of the invention to provide a uniform, thin layered micromachine lubricant that is strongly bonded to micromachine surfaces.

It is yet another object of the invention to provide a micromachine lubricant with electrical passivation characteristics.

These and other objects are achieved by a method of lubricating a micromachine in a fluid-based process. The process includes the traditional fluid-based process of releasing a sacrificial protective layer encasing a micromachine. The releasing step exposes hydrophobic micromachine surfaces. The hydrophobic micromachine surfaces are then converted to hydrophilic micromachine surfaces. A monolayer lubricant is subsequently constructed on the hydrophilic micromachine surfaces. Thereafter, the micromachine is dried.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
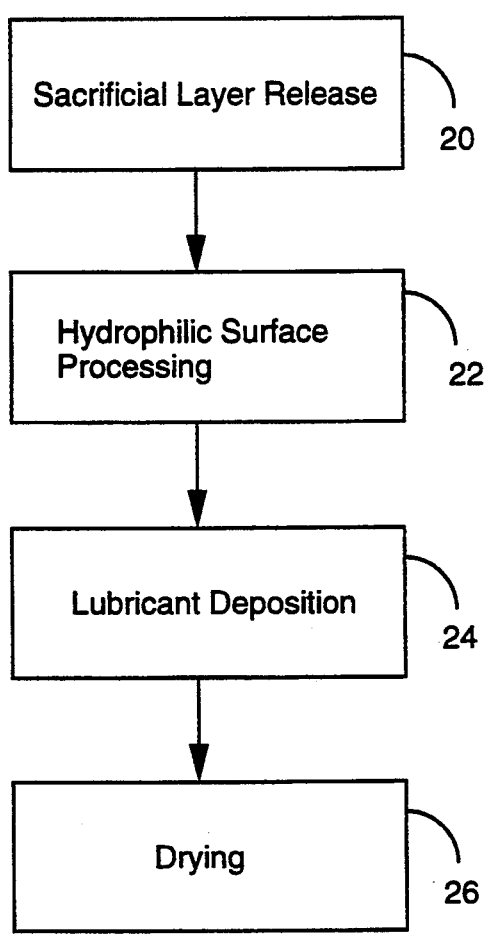
FIG. 1 depicts the general processing steps associated with the present invention.

FIG. 1 depicts the general processing steps associated with the deposition of a monolayer lubricant in accordance with the present invention. The first step associated with the process is the etching of the sacrificial layer of the micromachine (block 20). The functional parts of a micromachine are commonly formed in polycrystalline silicon (polysilicon) that is encased in a sacrificial material, such as silicon oxide. The sacrificial layer must be removed before utilizing the micromachine. Thus, all micromachine fabrication processes will include a release etch step (block 20).

The next step associated with the processing of a micromachine in accordance with the invention is to transform the exposed micromachine surface from a hydrophobic to a hydrophilic surface (block 22). This step is often incorporated into conventional release etch processes. In the present invention, this step is necessary to prepare the surface for the formation of a monolayer lubricant film. Thus, it can be appreciated that the processing associated with the present invention is incorporated into and is otherwise complementary with prior art micromachine processing steps. This step is performed by using a series of transition baths to replace excess entrained micromachine surface water with a non-polar solvent that is compatible with the subsequent lubrication application process.

The next step associated with the present invention is the construction of a lubricant surface on the micromachine (block 24). In accordance with the invention, a self-assembled alkyltrichlorosilane monolayer is used as the lubricant. Self-assembly is a process which selectively deposits a particular material on a fresh reactive surface, but not on surfaces which are already covered by that material. Coverage is therefore limited to a single densely packed molecular layer of that material. Thus, the process self-terminates after single layer coverage is achieved. An effective alkyltrichlorosilane is octadecyltrichlorosilane (OTS; $C_{18}H_{37}SiCl_3$). In a dilute non-polar non-aqueous solution, OTS will deposit on treated silicon, polysilicon, and silicon nitride surfaces. The OTS reacts with a thin adsorbed water layer that is present on these surfaces when they are rendered hydrophilic (block 22), to form a single layer of molecules that are chemically bonded to the surface.

Thus, the lubricant construction step of the invention (block 24) yields a micromachine with a monolayer lubricant surface. It will be appreciated by those skilled in the art that the layer formation step is incorporated into standard micromachine processing steps. Thus, unlike the prior art in self-assembled film formation, the lubricant is applied in a process with aqueous-based chemistry, without intervening drying of micromachine surfaces. The wet process application of the lubricant insures that the lubricant reaches hidden and contacting surfaces. In addition, the processing results in a uniform lubrication layer.

Those skilled in the art will recognize a number of additional benefits associated with the invention. First, the monolayer lubricant of the invention strongly bonds to the micromachine surface. Next, the bonded lubricant film does not produce capillarity and viscosity problems. Finally, the lubricant provides electrical passivation.

The final processing step depicted in FIG. 1 is a conventional drying step (block 26). Micromachine fabrication processes are typically terminated with such a step. As previously indicated, lubricants are typically applied after the drying step, unlike the present invention which applies a lubricant prior to the drying step.

Thus, the general processing steps associated with the present invention have now been disclosed. The benefits associated with this processing have also been discussed. Attention presently turns to a more detailed explanation of the processing associated with a micromachine constructed in accordance with the invention.

Figure 2:
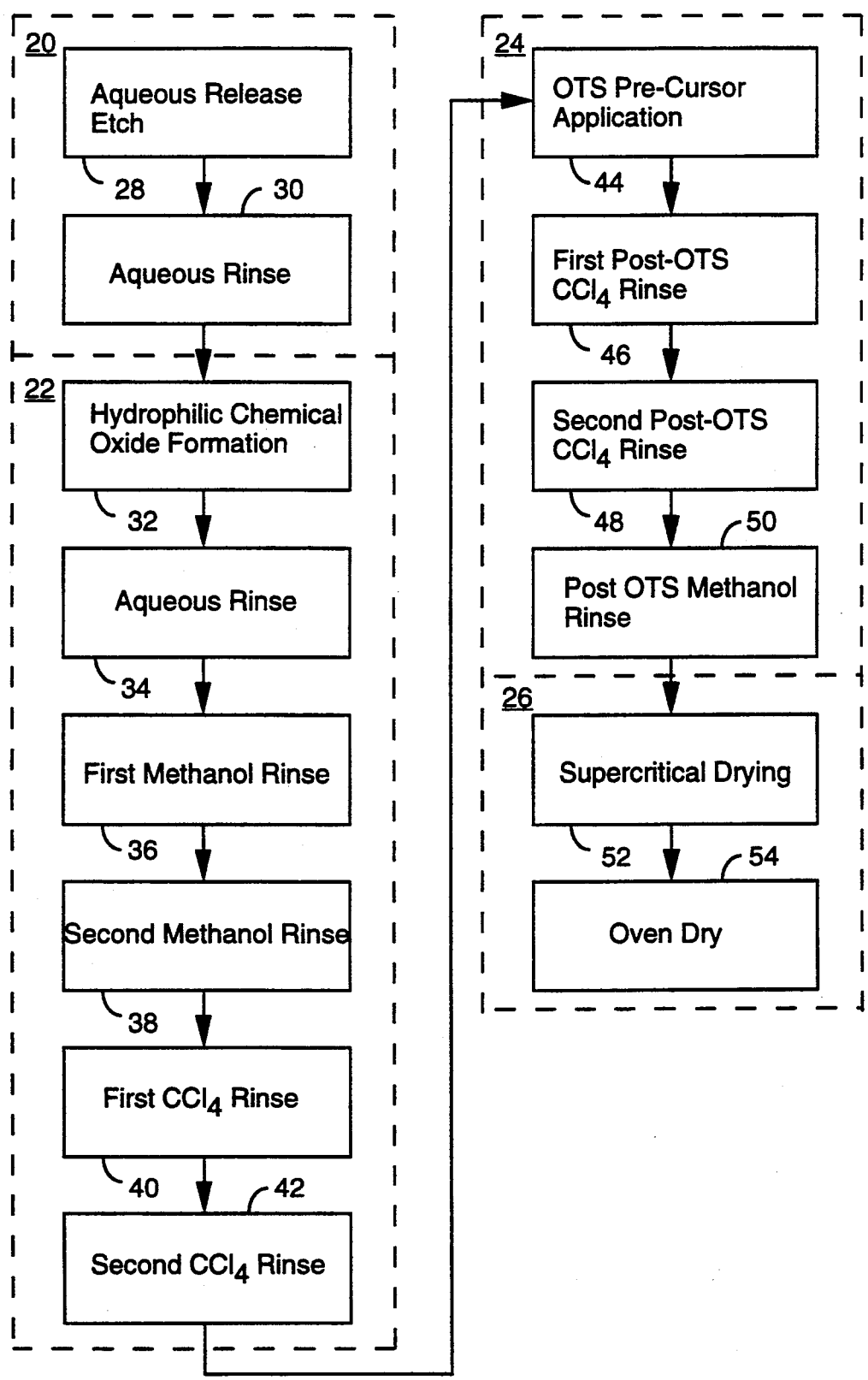
FIG. 2 depicts the specific processing steps associated with one embodiment of the present invention.

FIG. 2 depicts a more detailed representation of the processing flow associated with the present invention. The boxes formed in phantom correspond to the boxes of FIG. 1.

The first processing step depicted in FIG. 2 is an aqueous release etch (block 28). This step will typically be performed with hydrofluoric (HF) acid. The duration of the release etch step depends on the details of the etch mixture, the sacrificial layer composition and thickness.

The next step associated with FIG. 2 is an aqueous rinse (block 30). In general, this will entail an approximately 15 minute aqueous rinse to remove any remaining HF etchant.

The next steps depicted in FIG. 2 are associated with hydrophilic surface processing (block 22). The initial step in this processing is the formation of a hydrophilic chemical oxide (block 32). This may be accomplished with an approximately 5 to 15 minute exposure to a hydrophilic chemical oxide promoter such as Piranha ($H_2O_2:H_2SO_4$), RCA SC-1, or room temperature $H_2O_2$. This treatment changes silicon and polysilicon surfaces from hydrophobic to hydrophilic. Thus, the surface will have a thin layer of adsorbed water. This step is frequently performed in conventional release etch processes.

The next step in FIG. 2 is an aqueous rinse step (block 34). This step will involve an approximately 15 minute rinse to remove any remaining hydrophilic surface treatment solution. This step is also performed in conventional release etch processes.

Processing then proceeds to a first methanol rinse (block 36). This step, entailing an approximately 5 minute methanol rinse, displaces excess surface water. The subsequent processing step is a second methanol rinse (block 38). Preferably, rinsing is performed for approximately 15 minutes to further dilute and displace excess water.

A first $CCl_4$ rinse (block 40) and a second $CCl_4$ rinse (block 42) are then used to remove all residual methanol. Preferably, the first $CCl_4$ rinse is for approximately 5 minutes and the second $CCl_4$ rinse is for approximately 15 minutes. At this juncture, the micromachine is prepared for monolayer lubricant formation (block 24).

The first step associated with monolayer lubricant formation is the application of a octadecyltrichlorosilane (OTS) pre-cursor (block 44). In a preferable embodiment, an OTS pre-cursor solution is applied for 5–20 minutes. The OTS pre-cursor solution may be 2 mM OTS in 4:1 hexadecane: $CCl_4$. This step constitutes the OTS self-assembly application. The resulting surfaces become autophobic almost immediately.

To remove unbonded OTS material, a first post-OTS $CCl_4$ rinse is employed (block 46). Preferably, this rinse step is for approximately 5 minutes. A second post-OTS $CCl_4$ rinse for approximately 15 minutes is subsequently employed (block 48). Thereafter, a post OTS methanol rinse (block 50) is invoked for approximately 15 minutes to remove any unbonded OTS material. Thus, at this juncture, a monolayer lubricant exists on the processed micromachine.

The final processing steps relate to drying the micromachine. The processing of the invention is compatible with conventional drying steps. Thus, a supercritical or sublimation drying step (block 52) may be included, but is not necessary. The final step associated with the processing of FIG. 2 is an oven dry to cure the OTS (block 54). The oven drying may be accomplished in approximately 10 minutes at approximately 150° C. This step desorbs any remaining unbonded OTS material, and improves monolayer wear resistance properties by cross-linking neighboring OTS molecules.

Processing of micromachines consistent with the described steps will produce a uniform lubricant monolayer film of approximately 2.3–2.5 nm.

The foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following Claims and their equivalents.

We claim:

1. A method of fabricating a lubricated micromachine, said method comprising the steps of:
    releasing a protective sacrificial layer from said micromachine in an aqueous immersion process;
    converting hydrophobic surfaces of said micromachine to hydrophilic surfaces in an aqueous immersion process;
    applying a thin-film lubricant to said micromachine in a fluid-based immersion process after said releasing step and before said micromachine is dried; and
    drying said thin-film lubricant after said applying step.

2. The method of claim 1 wherein said aqueous immersion process of said releasing step includes an aqueous release etch step and an aqueous rinse step.

3. The method of claim 1 wherein said converting step includes the steps of:
    forming a hydrophilic chemical oxide on said micromachine surface;
    rinsing said micromachine surface with an aqueous solution;
    rinsing said micromachine surface with a methanol solution; and
    rinsing said micromachine surface with a $CCl_4$ solution.

4. The method of claim 1 wherein said applying step includes the step of applying a monolayer lubricant to said micromachine.

5. The method of claim 4 wherein said applying step includes the step of applying an octadecyltrichlorosilane pre-cursor to said micromachine.

6. The method of claim 5 wherein said applying step includes the steps of:
    rinsing said micromachine with a $CCl_4$ solution; and
    rinsing said micromachine with a methanol solution.

7. A micromachine formed in accordance with the method of claim 1.

8. A micromachine formed in accordance with the method of claim 2.

9. A micromachine formed in accordance with the method of claim 3.

10. A micromachine formed in accordance with the method of claim 4.

11. A micromachine formed in accordance with the method of claim 6.

12. A method of fabricating a micromachine, said method including the steps of:
    releasing a sacrificial protective layer encasing said micromachine in an aqueous process to expose hydrophobic micromachine surfaces;
    converting said hydrophobic micromachine surfaces to hydrophilic micromachine surfaces in an aqueous process;
    constructing lubricant surfaces on said hydrophilic micromachine surfaces in a fluid-based process before said micromachine is dried; and
    drying said micromachine.

13. The method of claim 12 wherein said releasing step includes an aqueous release etch step and an aqueous rinse step.

14. The method of claim 13 wherein said converting step includes the steps of:
    forming a hydrophilic chemical oxide on said micromachine surfaces;
    rinsing said micromachine surfaces with an aqueous solution;
    rinsing said micromachine surfaces with a methanol solution; and
    rinsing said micromachine surfaces with a $CCl_4$ solution.

15. The method of claim 14 wherein said constructing step includes the step of applying an octadecyltrichlorosilane pre-cursor to said micromachine surfaces.

16. The method of claim 15 wherein said constructing step includes the steps of:
    rinsing said micromachine surfaces with a $CCl_4$ solution; and
    rinsing said micromachine surfaces with a methanol solution.

17. A micromachine formed in accordance with the method of claim 12.

18. A micromachine formed in accordance with the method of claim 14.

19. A micromachine formed in accordance with the method of claim 16.

* * * * *